(12) United States Patent
Unno et al.

(10) Patent No.: US 9,591,756 B2
(45) Date of Patent: Mar. 7, 2017

(54) HIGH-FREQUENCY PACKAGE

(75) Inventors: Tomoyuki Unno, Tokyo (JP); Kazuyoshi Inami, Tokyo (JP); Kosuke Yasooka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 28 days.

(21) Appl. No.: 14/119,295

(22) PCT Filed: Jan. 12, 2012

(86) PCT No.: PCT/JP2012/050501
§ 371 (c)(1),
(2), (4) Date: Nov. 21, 2013

(87) PCT Pub. No.: WO2012/160837
PCT Pub. Date: Nov. 29, 2012

(65) Prior Publication Data
US 2014/0069706 A1    Mar. 13, 2014

(30) Foreign Application Priority Data
May 24, 2011    (JP) .................. 2011-115665

(51) Int. Cl.
H05K 1/11    (2006.01)
H05K 1/02    (2006.01)
(Continued)

(52) U.S. Cl.
CPC ........ H05K 1/115 (2013.01); H01L 23/49822 (2013.01); H01L 23/66 (2013.01);
(Continued)

(58) Field of Classification Search
CPC ............... H01L 23/49822; H01L 23/66; H01L 2223/6622; H01L 2224/48227;
(Continued)

(56) References Cited

U.S. PATENT DOCUMENTS 6,617,526 B2 *   9/2003   Miller ..................... 174/261
6,875,638 B2 *   4/2005   Uchida ............... H01L 23/36
                                                     257/E21.503
(Continued)

FOREIGN PATENT DOCUMENTS

JP        6 85099       3/1994
JP      2000 332422    11/2000
(Continued)

OTHER PUBLICATIONS

Office Action issued Sep. 2, 2014 in Japanese Patent Application No. 2013-516223 (with English language translation).
(Continued)

*Primary Examiner* — Ishwarbhai B Patel
(74) *Attorney, Agent, or Firm* — Oblon, McClelland, Maier & Neustadt, L.L.P.

(57) ABSTRACT

In a multilayer substrate, a quasi-coaxial line is formed as a structure for transmitting a high-frequency signal generated by a mounted high-frequency device from an uppermost layer to a lowermost layer to externally output and for transmitting an externally input high-frequency signal from the lowermost layer to the high-frequency device. The quasi-coaxial line has: a central conductor being a vertical through hole via that connects between a metal pattern formed on an upper surface of the uppermost layer and a metal pattern formed on a lower surface of the lowermost layer; and outer conductors being a plurality of interlayer vias that are circularly arranged around the central conductor and connect between two or more layers. Whole or a part of the vertical through hole via is substituted by a capacitor structure formed of conductor pads facing each other without any via.

4 Claims, 1 Drawing Sheet

1: MULTILAYER SUBSTRATE
2: HIGH-FREQUENCY DEVICE
3: WIRE
4, 12: MICROSTRIP LINE
5: QUASI-COAXIAL LINE
6, 8: INTERLAYER VIA
7: CAPACITOR STRUCTURE
9a, 9b, 9c: CONDUCTOR PAD
10a, 10b: SOLDER BALL
11: ANOTHER MULTILAYER SUBSTRATE
13: GROUND CONDUCTOR
14: CRACK

(51) Int. Cl.
*H05K 1/18* (2006.01)
*H01L 23/498* (2006.01)
*H01L 23/66* (2006.01)
*H01P 5/02* (2006.01)
*H01P 5/08* (2006.01)

(52) U.S. Cl.
CPC ........... *H01P 5/028* (2013.01); *H05K 1/0222* (2013.01); *H05K 1/18* (2013.01); *H01L 2223/6622* (2013.01); *H01L 2224/48091* (2013.01); *H01L 2224/48227* (2013.01); *H01L 2924/1423* (2013.01); *H01L 2924/15311* (2013.01); *H01P 5/085* (2013.01); *H05K 1/0216* (2013.01); *H05K 1/0231* (2013.01); *H05K 2201/09818* (2013.01)

(58) Field of Classification Search
CPC ... H01L 2924/1423; H01L 2224/48091; H01L 2924/15311; H01L 2924/00; H01L 2924/00014; H01P 5/028; H05K 1/115; H05K 2201/09809; H05K 1/0215; H05K 1/0216; H05K 1/0218; H05K 1/0219; H05K 1/0222; H05K 1/0225; H05K 1/0231; H05K 1/111; H05K 1/112; H05K 1/113; H05K 1/162; H05K 3/30; H05K 3/46; H05K 2201/09481
USPC ................. 174/250–268; 361/760, 767, 803, 361/792–795
See application file for complete search history.

(56) References Cited

U.S. PATENT DOCUMENTS

| | | | | |
|---|---|---|---|---|
| 7,408,120 | B2* | 8/2008 | Kim et al. | 174/262 |
| 7,678,660 | B2* | 3/2010 | Tanaka | 438/396 |
| 2003/0218870 | A1* | 11/2003 | Fisher et al. | 361/792 |
| 2005/0146390 | A1 | 7/2005 | Baek | |
| 2007/0147014 | A1* | 6/2007 | Chang et al. | 361/760 |
| 2007/0278001 | A1* | 12/2007 | Mayder et al. | 174/262 |
| 2010/0149725 | A1* | 6/2010 | Hasegawa | B32B 18/00 361/321.4 |

FOREIGN PATENT DOCUMENTS

| | | |
|---|---|---|
| JP | 2005 197720 | 7/2005 |
| JP | 2006 80239 | 3/2006 |
| JP | 2008 227177 | 9/2008 |
| JP | 2010 154412 | 7/2010 |
| JP | 2011 187812 | 9/2011 |

OTHER PUBLICATIONS

International Search Report Issued Feb. 21, 2012 in PCT/JP12/050501 Filed Jan. 12, 2012.
Office Action issued Oct. 10, 2015 in Japanese Patent Application No. 201280024505.0 (with partial English translation).

* cited by examiner

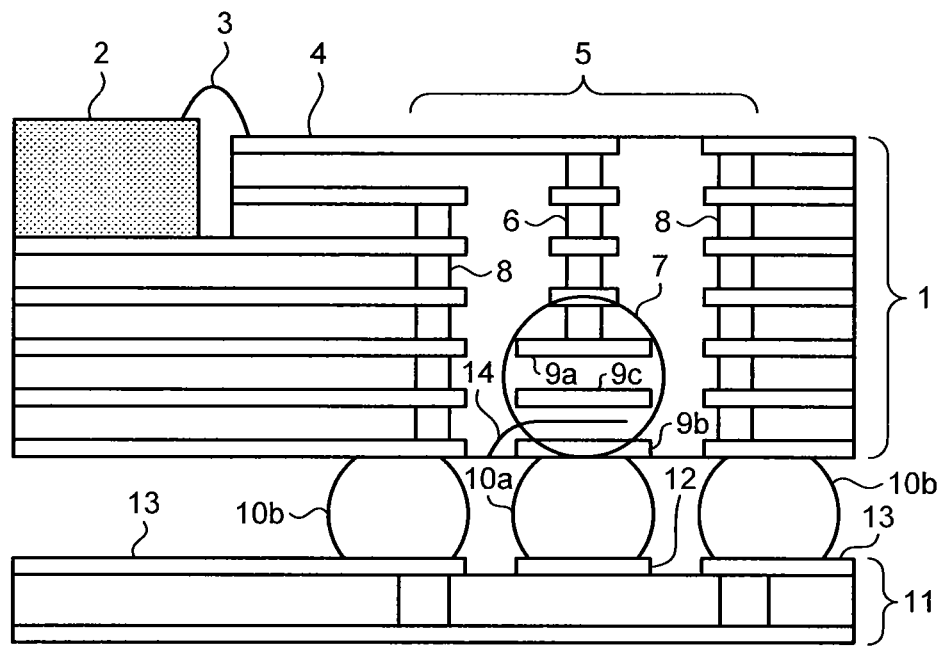
1: MULTILAYER SUBSTRATE
2: HIGH-FREQUENCY DEVICE
3: WIRE
4, 12: MICROSTRIP LINE
5: QUASI-COAXIAL LINE
6, 8: INTERLAYER VIA
7: CAPACITOR STRUCTURE
9a, 9b, 9c: CONDUCTOR PAD
10a, 10b: SOLDER BALL
11: ANOTHER MULTILAYER SUBSTRATE
13: GROUND CONDUCTOR
14: CRACK

HIGH-FREQUENCY PACKAGE

FIELD

The present invention relates to a high-frequency package used in an electronic device that operates in a microwave band or a millimeter-wave band.

BACKGROUND

A high-frequency package used in an electronic device that operates in a microwave band or a millimeter-wave band is fabricated by packaging a multilayer substrate having mounted thereon a high-frequency device (MMIC: Monolithic Microwave Integrated Circuit) that operates in the microwave band or the millimeter-wave band. An external electric connection of the high-frequency package is attained through a lowermost layer of the multilayer substrate.

For this purpose, a quasi-coaxial line that connects between an uppermost layer and the lowermost layer is formed in the multilayer substrate of the high-frequency package. The quasi-coaxial line is a structure for externally outputting a high-frequency signal generated by the mounted high-frequency device and for transferring an externally input high-frequency signal to the high-frequency device.

As disclosed in Patent Literature 1 for example, the quasi-coaxial line has a central conductor and outer conductors. The central conductor is a vertical through hole via that connects between a metal pattern formed on an upper surface of the uppermost layer and connected to an input/output port of the high-frequency device and a metal pattern formed on a lower surface of the lowermost layer. The outer conductors are a plurality of interlayer vias that are circularly arranged around the central conductor and connect between two or more layers. The metal pattern formed on the lower surface of the lowermost layer is connected to another multilayer substrate through a BGA (Ball Grid Array).

CITATION LIST

Patent Literature

Patent Literature 1: Japanese Patent Application Laid-Open No. H6-85099

SUMMARY

Technical Problem

However, at a time of manufacturing the multilayer substrate, crack is sometimes caused in a certain layer of the substrate due to thermal stress and the like. Then, at a time of operation where the high-frequency device is implemented, the crack may extend to a portion where the vertical through hole via as the central conductor is formed. In this case, the extended crack breaks the vertical through hole via, which causes a problem of considerable deterioration in a pass characteristic of the high-frequency signal.

The present invention has been achieved in view of the above problem, and an object of the present invention is to provide a high-frequency package having a multilayer substrate and configured to suppress deterioration in a pass characteristic of a high-frequency signal even if a crack is so formed as to cut across a region where a central conductor of a quasi-coaxial line is formed.

Solution to Problem

In order to solve the above-mentioned problem and achieve the above-mentioned object, a high-frequency package according to the present invention has a multilayer substrate in which a quasi-coaxial line is formed as a structure for transmitting a high-frequency signal generated by a mounted high-frequency device from an uppermost layer to a lowermost layer to externally output and for transmitting an externally input high-frequency signal from the lowermost layer to the high-frequency device. The quasi-coaxial line has: a central conductor being a vertical through hole via that connects between a metal pattern formed on an upper surface of the uppermost layer and a metal pattern formed on a lower surface of the lowermost layer; and outer conductors being a plurality of interlayer vias that are circularly arranged around the central conductor and connect between two or more layers. The high-frequency package is characterized in that whole or a part of the vertical through hole via is substituted by a capacitor structure formed of conductor pads facing each other without any via.

Advantageous Effects of Invention

According to the present invention, even if a crack caused in an inner layer of the substrate extends to a region where the central conductor of the quasi-coaxial line is formed, a structure of the quasi-coaxial line serving as a transmission path of the high-frequency signal is maintained due to the capacitor structure. It is therefore possible to suppress deterioration in the pass characteristic of the high-frequency signal.

BRIEF DESCRIPTION OF DRAWING

FIG. 1 is a cross-sectional view of a configuration of a main part of a high-frequency package according to an embodiment of the present invention.

DESCRIPTION OF EMBODIMENTS

Exemplary embodiments of a high-frequency package according to the present invention will be described below in detail with reference to the accompanying drawings. It should be noted that the present invention is not limited to the embodiments.

Embodiment

FIG. 1 is a cross-sectional view of a configuration of a main part of a high-frequency package according to an embodiment of the present invention. In FIG. 1, a high-frequency device (MMIC) 2 is mounted on a multilayer substrate 1 that constitutes the high-frequency package. An input/output port of the high-frequency device 2 is connected through a wire 3 to one end of a microstrip line 4 that is formed on an upper surface of an uppermost layer of the multilayer substrate 1.

In the multilayer substrate 1, a quasi-coaxial line 5 is formed between the uppermost layer and a lowermost layer. A central conductor of the quasi-coaxial line 5 has an interlayer via 6 and a capacitor structure 7. One end of the interlayer via 6 is connected to the microstrip line 3, and the other end thereof is formed to penetrate through plural inner layers. The capacitor structure 7 is formed between the other end of the interlayer via 6 and the lowermost layer. Outer conductors of the quasi-coaxial line 5 are constituted by a plurality of interlayer vias 8 that are circularly arranged around the central conductor (the interlayer via 6+the capacitor structure 7) and connect between two or more layers.

In general, a central conductor of a quasi-coaxial line formed in a multilayer substrate is constituted by a vertical through hole via that penetrates and connects between the uppermost layer and the lowermost layer. In the case of FIG. 1, however, a part of the vertical through hole via is substituted by the capacitor structure 7.

In FIG. 1, the capacitor structure 7 is formed of conductor pads 9a, 9b, and 9c that are respectively formed in three adjacent layers and face each other. The conductor pad 9a is connected to the other end of the interlayer via 6, and the conductor pad 9b is formed on a lower surface of the lowermost layer. The conductor pad 9c is placed between the conductor pad 9a and the conductor pad 9b. That is, the capacitor structure 7 shown in FIG. 1 has a configuration in which two capacitors are placed in series.

The lowermost layer of the multilayer substrate 1 is mounted on an upper surface of another multilayer substrate 11 through solder balls 10a and 10b that constitute a BGA. The solder ball 10a connects between the conductor pad 9b serving as the other end of the central conductor of the quasi-coaxial line 5 and a microstrip line 12 formed on an upper surface of the multilayer substrate 11. The solder ball 10b connects between the interlayer via 8 serving as the outer conductor of the quasi-coaxial line 5 and a ground conductor 13 formed on the upper surface of the multilayer substrate 11.

In the configuration described above, let us consider a case where crack 14 is caused in an inner layer of the multilayer substrate 1 due to thermal stress and the like at a time of manufacturing the substrate and, at a time of operation where the high-frequency device 2 is implemented, the crack 14 extends to a region where the central conductor is formed. Even in this case, a structure of the quasi-coaxial line 5 serving as the transmission path of the high-frequency signal is maintained due to the capacitor structure 7. It is therefore possible to suppress deterioration in the pass characteristic of the high-frequency signal.

In the example shown in FIG. 1, the crack 14 is caused in a substrate layer where the capacitor structure 7 is formed. However, the crack 14 can be caused in any inner layer of the substrate. For example, the crack 14 may be caused in any of the plural layers where the interlayer via 6 is formed. In this case, salvation by the capacitor structure 7 does not work and the central conductor is broken. It is therefore preferable that whole of the central conductor of the quasi-coaxial line 5 is formed of a capacitor structure. That is, a plurality of capacitors are placed in series between the uppermost layer and the lowermost layer. It may be said that FIG. 1 illustrates a case where an inner substrate layer where a crack is caused due to thermal stress can be specified empirically.

According to the present embodiment as described above, even if a crack is so formed as to cut across a region where the central conductor of the quasi-coaxial line is formed, a structure of the quasi-coaxial line serving as the transmission path of the high-frequency signal is maintained due to the capacitor structure. It is therefore possible to suppress deterioration in the pass characteristic of the high-frequency signal.

INDUSTRIAL APPLICABILITY

As described above, the high-frequency package according to the present invention is useful as a high-frequency package having a multilayer substrate and capable of suppressing deterioration in a pass characteristic of a high-frequency signal even if a crack is so formed as to cut across a region where a central conductor is formed.

REFERENCE SIGNS LIST 1 multilayer substrate
2 high-frequency device (MMIC)
3 wire
4, 12 microstrip line
5 quasi-coaxial line
6, 8 interlayer via
7 capacitor structure
9a, 9b, 9c conductor pad
10a, 10b solder ball
11 another multilayer substrate
13 ground conductor
14 crack

The invention claimed is:

1. A high-frequency package comprising a multilayer substrate in which a quasi-coaxial line is formed as a structure for transmitting a high-frequency signal generated by a mounted high-frequency device from an uppermost layer to a lowermost layer to externally output and for transmitting an externally input high-frequency signal from the lowermost layer to the high-frequency device,
    the quasi-coaxial line comprising:
    a central conductor that connects between a first metal pattern formed on an upper surface of the uppermost layer and a second metal pattern formed on a lower surface of the lowermost layer; and
    outer conductors being a plurality of first interlayer vias that are circularly arranged around the central conductor and connect between two or more layers,
    wherein the central conductor is formed by:
    a second interlayer via having one end connected to the first metal pattern and an opposite end formed to penetrate through at least one layer of the multilayer substrate; and
    a capacitor structure formed between the opposite end of the second interlayer via and the lower surface of the lowermost layer of the multilayer substrate,
    wherein the outer conductors of the quasi-coaxial line are connected to ground, and
    wherein the capacitor structure is formed of at least three conductor pads formed, respectively, in a corresponding number of adjacent layers of the multilayer substrate and facing each other,
    wherein the at least three conductor pads include an uppermost layer conductor pad connected to the opposite end of the second interlayer via, a lowermost layer conductor pad directly connected to a solder ball surrounded by a ground pad forming the ground, and an intermediate layer conductor pad placed between the uppermost layer conductor pad and the lowermost layer conductor pad,
    wherein the uppermost layer conductor and the intermediate layer conductor pad face each other and together form a first capacitor, and the lowermost layer conductor pad and the intermediate layer conductor pad face each other and together form a second capacitor, the first capacitor and the second capacitor being placed in series.

2. A high-frequency package comprising:
a high-frequency device;
a multilayer substrate on whose top surface the high-frequency device is mounted and to whose bottom surface solder balls are connected;
a surface layer conductor pattern formed on a surface of the multilayer substrate and transmitting a high-frequency signal output from the high-frequency device; and
a quasi-coaxial line formed within the multilayer substrate,
wherein the quasi-coaxial line comprises:
a central conductor comprising:
  a first interlayer via connected to the surface layer conductor pattern and penetrating through at least one layer of the multilayer substrate; and
  a capacitor section including an uppermost layer conductor pad connected to the first interlayer via, a lowermost conductor pad directly connected to one of the solder balls surrounded by a ground pad forming a ground, and an intermediate layer conductor pad placed between the uppermost layer conductor pad and the lowermost layer conductor pad; and
outer conductors formed of a plurality of second interlayer vias arranged around the central conductor and connected to the ground, and
wherein the uppermost layer conductor pad and the intermediate layer conductor pad face each other and together form a first capacitor, and the lowermost layer conductor pad and the intermediate layer conductor pad face each other and together form a second capacitor, the first capacitor and the second capacitor being placed in series.

3. The high-frequency package according to claim 2, wherein the outer conductors are connected to another of the solder balls at the bottom surface of the multilayer substrate.

4. The high-frequency package according to claim 3, wherein the multilayer substrate is mounted on another substrate through the solderballs.

* * * * *